(12) United States Patent
Chen et al.

(10) Patent No.: US 6,459,098 B1
(45) Date of Patent: Oct. 1, 2002

(54) WINDOW FOR LIGHT EMITTING DIODE

(75) Inventors: John Chen, Los Angeles County; Bingwen Liang, Santa Clara County; Robert Shih, Los Angeles County, all of CA (US)

(73) Assignee: AXT, Inc., Fremont, CA (US)

( * ) Notice: Subject to any disclaimer, the term of this patent is extended or adjusted under 35 U.S.C. 154(b) by 0 days.

(21) Appl. No.: 09/626,441

(22) Filed: Jul. 26, 2000

(51) Int. Cl.[7] .......................... H01L 27/15; H01L 33/00
(52) U.S. Cl. ........................ 257/79; 257/79; 257/98; 257/99; 257/76; 257/94; 257/103
(58) Field of Search ........................ 257/79, 98, 99, 257/103, 613, 615, 100, 201, 76, 94

(56) References Cited

U.S. PATENT DOCUMENTS

| | | | | |
|---|---|---|---|---|
| 5,157,468 A | * | 10/1992 | Matsumoto ................ | 357/17 |
| 5,329,135 A | * | 7/1994 | Terakado .................. | 257/17 |
| 5,717,226 A | * | 2/1998 | Lee et al. ................ | 257/86 |
| 5,789,768 A | * | 8/1998 | Lee et al. ................ | 257/96 |
| 5,821,569 A | * | 10/1998 | Dutta ...................... | 257/96 |
| 6,072,203 A | * | 6/2000 | Nozaki et al. ............ | 257/194 |
| 6,225,648 B1 | * | 5/2001 | Hsieh et al. .............. | 257/95 |

* cited by examiner

*Primary Examiner*—Eddie Lee
*Assistant Examiner*—Joseph Nguyen
(74) *Attorney, Agent, or Firm*—Sonnenschein Nath & Rosenthal; Jean C. Edwards

(57) ABSTRACT

A Light Emitting Diode (LED) constructed of AlGaInP compounds includes a multi layer window which improves the efficiency of the diode. The window, in the order of formation, includes a lightly doped first layer formed of p doped GaP; a low impedance second layer formed of p GaAs; an amorphous conducting layer formed of Indium Tin Oxide (ITO), and a titanium\gold contact. In one embodiment, the contact forms ohmic connections with the second and third layers; and a Shottky diode connection with first layer. In a second embodiment, the contact forms an ohmic connection with the third layer; and is insulated from direct contact with the first layer.

4 Claims, 1 Drawing Sheet

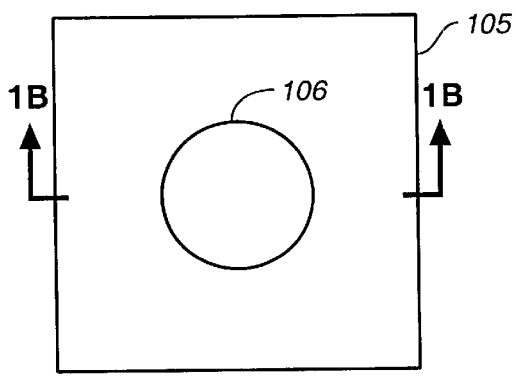
FIG._1A
(PRIOR ART)
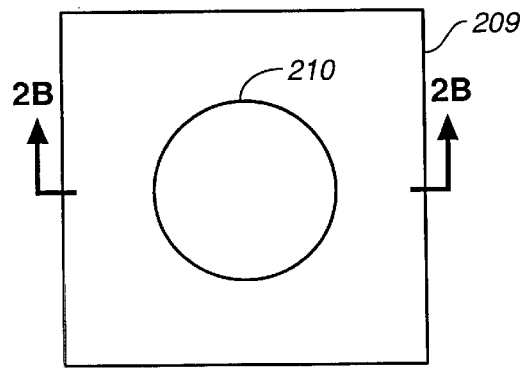
FIG._2A
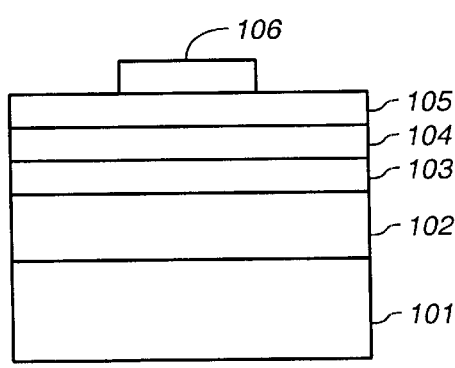
FIG._1B
(PRIOR ART)
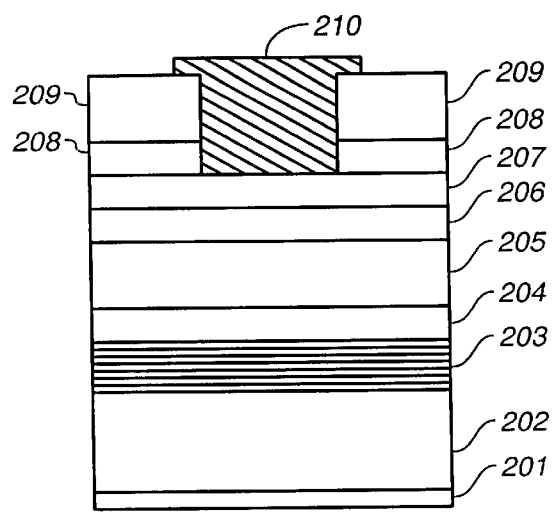
FIG._2B
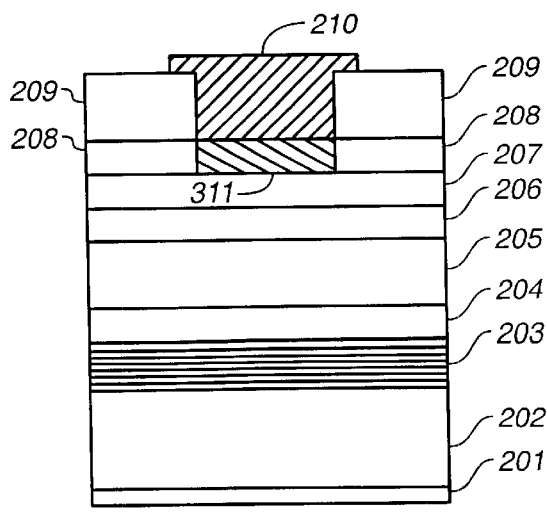
FIG._3

WINDOW FOR LIGHT EMITTING DIODE

The present invention relates to a window for a light emitting diode formed of an aluminum-gallium-indium-phosphate (AlGaInP) compound.

BACKGROUND OF THE INVENTION

A semiconductor light emitting diode (LED) includes a substrate, a light emitting structure, and a pair of electrical contacts for powering the diode, i.e., a substrate contact and a window contact. The substrate may be transparent or opaque; and the "substrate" contact, is formed on a surface thereof. The window contact is formed on a window surface.

LED structures composed of AlGaInP compounds can be designed to emit any selected one of a range of colors by tailoring the amount of Al in the compound. However, where the substrate and lower cladding layer are of n type AlGaInP compounds, it is difficult to achieve a low resistance p type AlGaInP compound for the upper cladding layer. Unfortunately, a relatively high resistance upper cladding layer does not provide full use of the surface of the light emitting structure. That is, current flowing between the window and substrate contacts tends to concentrate in a narrow "favored" path, which lies directly under the window contact. Thus, only that portion of the light emitting surface which lies in the favored path is activated.

A number of conventional arrangements provide a "window" which is interposed between the light emitting structure and the window contact to more fully utilize the light emitting surface. The conventional windows range from a single, thick layer of compounds other than AlGaInP, to a variety of multi-layer structures which "spread" the energizing current across the face of the light emitting surfaces.

Light generated by an LED exits directly from the outer face of the light emitting surface or via the window. The "window" contact is formed on the outer face of the light emitting surface, or is part of the window.

In any event, the window contact covers a substantial surface area and blocks emission of light generated directly thereunder. For example, in the case of an LED having a 10 mil by 10 mil square window, a four mil round metal contact will obscure about 12.2% of the window surface. However, the window contact cannot be measurably reduced in diameter, since the contact must be large enough to ensure its adhesion to the window surface.

For example, FIG. 1A represents a top view of a conventional LED having a 10 mil by 10 mil square window with a top layer 105, the window having a 4 mil circular metal contact 106. Typically, the window contact is made of gold (Au). The conventional LED of FIG. 1B includes a metal substrate contact 101, an "n" GaAs substrate 102, an "n" cladding layer 103, an active region 104, a p cladding layer 105, and a metal window contact 106. As explained earlier herein, current which flows between the window contact 106 and the substrate contact 101 concentrates in a "favored" path directly under the window contact 101. Since, only a small area of the active layer lies in that current path, much of the light emitting potential of the LED is dormant. Additionally, most of the light emitted through layer 105 is intercepted by the opaque contact 106. In routine observations, it is noted that under the stated conditions, the light which is emitted by the LED appears as a thin halo surrounding contact 106.

Thus, an improved window structure which allows increased emission of light therethrough when used with AlGaNP compounds, is needed.

SUMMARY OF THE INVENTION

An apparatus consistent with the present invention includes a semiconductor light emitting diode having a substrate, a substrate electrical contact, a light emitting structure, and an improved window. The window interfaces directly with the light emitting structure, and, in the following stated order includes a lightly doped p GaP layer, a low resistance p GaAs layer, a transparent, amorphous conducting window layer, and a metal window contact. The conducting layer, by way of example, may be formed of indium tin oxide (ITO), tin oxide (TO), or zinc oxide (ZnO). Layers of other amorphous, conductive and transparent oxide compounds also may be suitable for construction of the window layer.

In a first embodiment consistent with the present invention, the metal contact passes through both the conducting layer and the GaAs layer to: (a) form an ohmic contact with those layers, and (b) contact the GaP layer and form a Shottky diode connection therewith.

In a second embodiment consistent with the present invention, the metal contact passes only through the conducting layer and contacts an insulator which is formed in the GaAs layer to isolate the metal contact from the GaP layer. As in the first embodiment, the metal window contact forms an ohmic contact with the conducting layer and the GaAs layer.

Advantageously, in both embodiments, the current path lying directly under the metal contact is eliminated and the current is widely spread over the face of the light emitting structure.

With elimination of the "favored" path, less light is generated from the portion of the diode interface which is directly under the window contact; and more light is generated from the remaining surface of that interface. The net result is an increase in the total light emitted through the window layer.

Advantageously, in accordance with this invention, all of the diode, other than the metal contacts, and the conducting layer, is grown in a continuous process.

BRIEF DESCRIPTION OF THE DRAWINGS

FIGS. 1A and 1B depict top and side views of a conventional LED;

FIGS. 2A and 2B are top and side views of an LED consistent with one embodiment of the present invention; and FIG. 3 is a side view of an LED consistent with another embodiment of the present invention.

DETAILED DESCRIPTION OF THE PREFERRED EMBODIMENTS

A first embodiment consistent with the present invention LED is illustrated schematically in FIGS. 2A and 2B. The top view of FIG. 2A represents an LED having a 10 mil by 10 mil square amorphous transparent layer 209 surrounding a 5 mil circular metal contact 210.

In FIG. 2B, elements 201 (i.e., substrate contact) through 206 form a light emitting diode, with the window consistent with that of the present invention including, at least, elements 207 through 210.

In the example depicted in FIG. 2B, the elements 203 through 208 are grown in sequence upon substrate 202 which is a single crystal n doped GaAs wafer. Element 203 is an optional Distributed Bragg Reflector (DBR); layer 204 is an n AlGaInP lower cladding layer; element 205 is an active region; layer 206 is a p AlGaInP upper cladding layer; 207 is a lightly doped p GaP first window layer; 208 is a low resistance p GaAs second window layer; 209 is an amorphous, transparent conducting layer; and 210 is a metal window contact.

As stated above, first window layer 207 is formed of p doped GaP, and second window layer 208 is formed of p doped GaAs. Layer 209 is formed of an amorphous conducting material having a thickness of 100 to 1,000 nm, and window contact 210 is formed of gold or of a gold compound. The conducting layer may be formed of indium tin oxide (ITO); tin oxide (TO) or zinc oxide (ZnO). Contact 210 may be formed of Ti/Au.

Layers 203 through 208 are grown in a continuous metal organic chemical vapor deposition (MOCVD) process. After such growth is completed, hydrogen carrier gas flow is terminated, and flowing molecular nitrogen gas is introduced into the reactor. The reactor temperature is then reduced to a value below the growth temperature and the flow of the growth gases is stopped. The remaining cooldown of the reactor to room temperature includes a period of annealing of the GaAs layer 208 at a temperature of about 600 degrees C. This avoids passivation of the p dopant in layer 208.

The completed wafer, as formed above, is removed from the MOCVD reactor and completion of the remainder of the LED of FIG. 2b is implemented as follows. The amorphous conducting layer 209, i.e., ITO—is installed by sputtering on top of the second layer 208. A hole is etched through layers 209 and 208 to reach layer 207. A titanium/gold compound is then evaporated into the resulting void and over layer 209 as illustrated in FIG. 2B. In this first embodiment consistent with the present invention, the interface between contact 210 and the lightly doped GaP layer 207 forms a Schottky diode. Thus, with the low operating voltage applied to contacts 201 and 210, the Schottky diode inhibits the flow of energizing current directly from contact 210 to layer 207.

The window structure consistent with the present invention as exemplified in FIG. 2B, eliminates the favored current path through the LED directly under the window contact 210, and widely distributes the energizing current quite evenly over a substantial portion of the face of the active layer. Accordingly, the light emitted through the window is increased without increasing either the surface area of the active layer, or the energizing current requirements.

FIG. 3 illustrates schematically a second embodiment consistent with the present invention. Those elements of FIG. 3 which are unchanged from FIG. 2B retain the same reference numerals as in FIG. 2. The window of FIG. 3 further includes an insulator 311 which is formed in layer 208 after a hole has been etched into the amorphous layer 209 and in the GaAs layer 208. Insulator 311 is formed by the evaporation of silicon oxide. The thickness of the insulator may be equal to, or slightly greater than, the thickness of layer 208. As in the production of the window exemplified in FIGS. 2a and 2b, a titanium/gold metal contact 210 is evaporated in the unfilled portion hole and on top of amorphous layer 209. In this second embodiment consistent with the present invention, the metal window contact 210 forms an ohmic connection with amorphous layer 209 and is insulated from the first layer 207. This second embodiment consistent with the present invention serves to eliminate the favored current path under the window contact 210 and widely spreads the energizing current across the surface of active layer 205.

The window structures exemplified by the embodiments depicted in FIGS. 2B and 3 can be used with any LED composed of AlGaInP compounds without limitation of the form of the light emitting structure, and with or without the optional Distributed Bragg Reflector (DBR).

The present invention has been described with particular attention to its preferred embodiments; however, it should be understood that variations and modifications within the spirit and scope of the invention may occur to those skilled in the art to which the invention pertains.

What is claimed is:

1. An AlGaInP semiconductor light-emitting diode (LED) assembly comprising:

a substrate;

a first input terminal electrically coupled to said substrate;

a plurality of layers formed on said substrate to form a light-emitting structure;

a window structure formed on said light-emitting structure; and a second input terminal;

wherein said window structure comprises:

a first layer comprised of a first p doped semiconductor material other than AlGaInP;

a second layer formed on said first layer and comprised of a second p doped semiconductor material other that AlGaInP and different from said p doped semiconductor material of said first layer;

a third layer formed on said second layer and comprised of an amorphous conductive material; and wherein said second input terminal comprises a metal contact which passes through an opening in said second layer and said third layer; forms ohmic connections with said second and third layers; and forms a Schottky diode connection with said first layer.

2. The AlGaInP semiconductor light-emitting diode (LED) assembly in accordance with claim 1, wherein said first layer is a p doped GaP layer; said second layer is a p doped GaAs layer; said third layer is a layer of one of Indium Tin Oxide, Tin Oxide, and Zinc Oxide; and said metal contact is formed of a gold compound.

3. A transparent window for an AlGaInP semiconductor light-emitting diode (LED) assembly comprising:

a first layer comprised of a first p doped semiconductor material other than AlGaInP;

a second layer formed on said first layer and comprised of a second p doped semiconductor material other than AlGaInP and different from the p doped semiconductor material of said first layer;

a third layer formed on said second layer and comprised of an amorphous conductive material and;

a metal contact which passes through an opening in said second and third layers to said first layer to form ohmic connections with said second and third layers and a Schottky diode connection with said first layer.

4. The transparent window for an Al GaInP semiconductor light-emitting diode (LED) assembly in accordance with claim 3, wherein said first layer is a p doped GaP layer; said second layer is a p doped GaAs layer; said third layer is a layer of one of Indium Tin Oxide, Tin Oxide, and Zinc Oxide; and said metal contact is formed of a gold compound.

* * * * *